(12) United States Patent
Ouderkirk et al.

(10) Patent No.: US 9,028,083 B2
(45) Date of Patent: May 12, 2015

(54) PHOSPHOR REFLECTOR ASSEMBLY FOR REMOTE PHOSPHOR LED DEVICE

(75) Inventors: Andrew J. Ouderkirk, St. Paul, MN (US); Nicholas T. Gabriel, Minneapolis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 91 days.

(21) Appl. No.: 13/991,073

(22) PCT Filed: Dec. 19, 2011

(86) PCT No.: PCT/US2011/065784
§ 371 (c)(1),
(2), (4) Date: May 31, 2013

(87) PCT Pub. No.: WO2012/091975
PCT Pub. Date: Jul. 5, 2012

(65) Prior Publication Data
US 2013/0279151 A1    Oct. 24, 2013

Related U.S. Application Data

(60) Provisional application No. 61/428,034, filed on Dec. 29, 2010, provisional application No. 61/487,423, filed on May 18, 2011, provisional application No. 61/547,346, filed on Oct. 14, 2011, provisional application No. 61/554,744, filed on Nov. 2, 2011.

(51) Int. Cl.
*F21K 99/00* (2010.01)
*H01L 33/50* (2010.01)
(Continued)

(52) U.S. Cl.
CPC ............ *F21K 9/56* (2013.01); *H01L 33/507* (2013.01); *H01L 33/60* (2013.01); *H01L 25/0753* (2013.01); *H01L 2924/0002* (2013.01)

(58) Field of Classification Search
CPC .......................................................... F21K 9/56
USPC ...................................................... 362/84, 343
See application file for complete search history.

(56) References Cited

U.S. PATENT DOCUMENTS

| 5,882,774 A | 3/1999 | Jonza |
| 6,783,349 B2 | 8/2004 | Neavin |

(Continued)

FOREIGN PATENT DOCUMENTS

| DE | 102007037875 | 2/2009 |
| DE | 102007059548 | 4/2009 |

(Continued)

OTHER PUBLICATIONS

Lin, "Design of the ring remote phosphor structure for phosphor-converted white-light-emitting diodes", *Japanese Journal of Applied Physics*, 2010, vol. 49, pp. 072101-1-072101-6.

(Continued)

*Primary Examiner* — Anabel Ton
(74) *Attorney, Agent, or Firm* — Gregg H. Rosenblatt

(57) ABSTRACT

Phosphor assemblies include a phosphor layer and a broadband reflector attached to the phosphor layer. The phosphor assembly can be combined with a short wavelength (e.g. blue) emitting LED and other optional components to provide a remote phosphor lighting system. At least some LED light passes through the phosphor layer before reaching the broadband reflector. The broadband reflector provides high reflectivity for both the LED light and the longer wavelength phosphor light. The degree of transparency or of transmission of the phosphor layer to LED light can be tailored to increase the broadband light output of the lighting system. Such increase can actually be achieved by decreasing the amount of phosphor used in the phosphor layer. The single pass transmission T of the phosphor layer to the LED light may be from 30 to 65%, and the reflectivity of the broadband reflector may be at least 90, 94, or 98%.

15 Claims, 9 Drawing Sheets

(51) Int. Cl.
*H01L 33/60* (2010.01)
*H01L 25/075* (2006.01)

(56) References Cited

U.S. PATENT DOCUMENTS

| | | | |
|---|---|---|---|
| 6,967,778 | B1 | 11/2005 | Wheatley |
| 7,091,653 | B2 | 8/2006 | Ouderkirk |
| 7,118,438 | B2 | 10/2006 | Ouderkirk |
| 7,196,354 | B1 | 3/2007 | Erchak |
| 7,201,497 | B2 | 4/2007 | Weaver, Jr. |
| 7,210,977 | B2 | 5/2007 | Ouderkirk |
| 7,312,560 | B2 | 12/2007 | Ouderkirk |
| 7,350,953 | B2 | 4/2008 | Wheatley |
| 7,431,479 | B2 | 10/2008 | Weaver, Jr. |
| 7,621,677 | B2 | 11/2009 | Yang |
| 2004/0145289 | A1 | 7/2004 | Ouderkirk |
| 2007/0001182 | A1 | 1/2007 | Schardt |
| 2010/0259918 | A1 | 10/2010 | Rains |
| 2011/0012147 | A1 | 1/2011 | Bierhuizen |
| 2013/0270587 | A1* | 10/2013 | Ouderkirk et al. .............. 257/89 |

FOREIGN PATENT DOCUMENTS

| | | |
|---|---|---|
| GB | 2428881 | 2/2007 |
| WO | WO 2004-068552 | 8/2004 |
| WO | WO 2009-134433 | 11/2009 |
| WO | WO 2010-128438 | 11/2010 |
| WO | WO 2011-088161 | 7/2011 |
| WO | WO 2012-091971 | 7/2012 |
| WO | WO 2012-091972 | 7/2012 |
| WO | WO 2012-091973 | 7/2012 |

OTHER PUBLICATIONS

International Search Report for PCT International Application No. PCT/US2011/065784, Mailed Apr. 4, 2012, 4 pages.

* cited by examiner

PHOSPHOR REFLECTOR ASSEMBLY FOR REMOTE PHOSPHOR LED DEVICE

FIELD OF THE INVENTION

This invention relates generally to light sources, with particular application to solid state light sources that incorporate a light emitting diode (LED) and a phosphor. The invention also relates to associated articles, systems, and methods.

BACKGROUND

Solid state light sources that emit broadband light are known. In some cases, such light sources are made by applying a layer of yellow-emitting phosphor onto a blue LED. As light from the blue LED passes through the phosphor layer, some of the blue light is absorbed, and a substantial portion of the absorbed energy is re-emitted by the phosphor as Stokes-shifted light at longer wavelengths in the visible spectrum, typically, yellow light. The phosphor thickness is small enough so that some of the blue LED light passes all the way through the phosphor layer, and combines with the yellow light from the phosphor to provide broadband output light having a white appearance.

Other LED-pumped phosphor light sources have also been proposed. In U.S. Pat. No. 7,091,653 (Ouderkirk et al.), a light source is discussed in which light from an LED is reflected by a long-pass reflector onto a phosphor layer. The phosphor layer emits visible (preferably white) light, which light is substantially transmitted by the long-pass reflector. The LED, phosphor layer, and long-pass filter are arranged in such a way that as light travels from the LED to the long-pass reflector it does not pass through the phosphor layer.

BRIEF SUMMARY

We have developed a new family of phosphor assemblies for use in remote phosphor lighting systems. The phosphor assemblies typically include a phosphor layer and a broadband reflector attached to the phosphor layer. The phosphor assembly can be used in combination with one or more short wavelength (e.g. blue) emitting LEDs, and other optional components, to provide a remote phosphor lighting system. In such systems, at least some light from the LED(s) passes through the phosphor layer before reaching the broadband reflector. The broadband reflector provides high reflectivity for both the LED light and the longer wavelength phosphor light. We have found that the degree of transparency (or degree of transmission) of the phosphor layer to LED light can be tailored, e.g. by appropriate selection of phosphor concentration and physical thickness of the phosphor layer, to increase the broadband light output of the lighting system. Such an increase in light output can actually be achieved by decreasing the amount of phosphor used in the phosphor layer. In some cases, the phosphor concentration and physical thickness of the phosphor layer may be selected to provide a single pass transmission T of the LED light through the phosphor layer. T may be selected to maximize the broadband light output of the lighting system. We have found that T may be, for example, in a range from 30 to 65%, or from 35 to 60%, or from 40 to 50%.

In some cases, the broadband reflector may have a reflectivity of at least 94%, or at least 98%, for the LED light and the phosphor light. The phosphor assembly may be made in roll form, e.g. using a polymeric base film or films, and then pieces of suitable size and shape may be cut from the roll for incorporation into a particular remote phosphor lighting system. Thus, the assembly may be die-cuttable. In some cases, the broadband reflector may attach directly to the phosphor layer, while in other cases, the broadband reflector may attach to the phosphor layer through one or more intermediate layers. The phosphor assembly may include an adhesive layer attached to the phosphor layer. The assembly may include a structural layer attached to the phosphor layer, the structural layer being self-supporting. The assembly may include a release liner adapted to carry the phosphor layer and the broadband reflector.

A remote phosphor lighting system may include the phosphor assembly in combination with one or more LEDs for providing the short wavelength LED light. Such a system may also include a dichroic reflector configured to reflect a first portion of the LED light, to transmit a second portion of the LED light, and to transmit a portion of the phosphor light.

We also describe remote phosphor lighting systems that provide a broadband light output. Such systems include one or more LEDs and a phosphor assembly. The LED(s) may emit LED light having one or more emission peaks in a range from 400 to 500 nm. The phosphor assembly may include a phosphor layer and a broadband reflector attached to the phosphor layer. The phosphor layer may be configured to absorb a portion of the LED light and emit phosphor light in response to the absorbed LED light, and the broadband reflector may have a reflectivity of at least 90% for the LED light and for the phosphor light. The broadband light output may include a portion of the phosphor light emitted by the phosphor assembly and a portion of the LED light reflected by the phosphor assembly. The phosphor layer may have a phosphor concentration and physical thickness tailored to provide a single pass transmission of the LED light through the phosphor layer of T, where T is selected to maximize the broadband light output. T may be in a range from 30 to 65%, or from 35 to 60%, or from 40 to 50%. The broadband reflector has a reflectivity of at least 94%, or at least 98%, for the LED light and for the phosphor light.

Such systems may also include a dichroic reflector configured to reflect a portion of the LED light emitted by the one or more LEDs to impinge on the assembly via light paths that do not pass through the assembly, the dichroic reflector also configured to transmit a portion of the LED light emitted by the one or more LEDs and to transmit a portion of the phosphor light. The systems may also include a lens member having an outer surface and an inner surface, and the dichroic reflector may be disposed on at least a portion of the outer surface. The dichroic reflector may be made to cover substantially all of the outer surface of the lens member, or it may cover at least 50%, 70%, or 80% of the area of the outer surface of the lens member. The phosphor assembly is oriented such that the phosphor layer is disposed between the lens member and the broadband reflector.

The broadband light output of such systems may be substantially white, and may include at least (1) LED light reflected by the assembly and transmitted by the dichroic reflector, and (2) phosphor light transmitted by the dichroic reflector. The broadband light output may further include (3) LED light transmitted by the dichroic reflector but not reflected by the assembly. The broadband light output may have CIE color coordinates (x, y), and x may be in a range from 0.25 to 0.4, and y may be in a range from 0.25 to 0.4.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

In the figures, like reference numerals designate like elements.

DETAILED DESCRIPTION OF ILLUSTRATIVE EMBODIMENTS

Figure 1A:
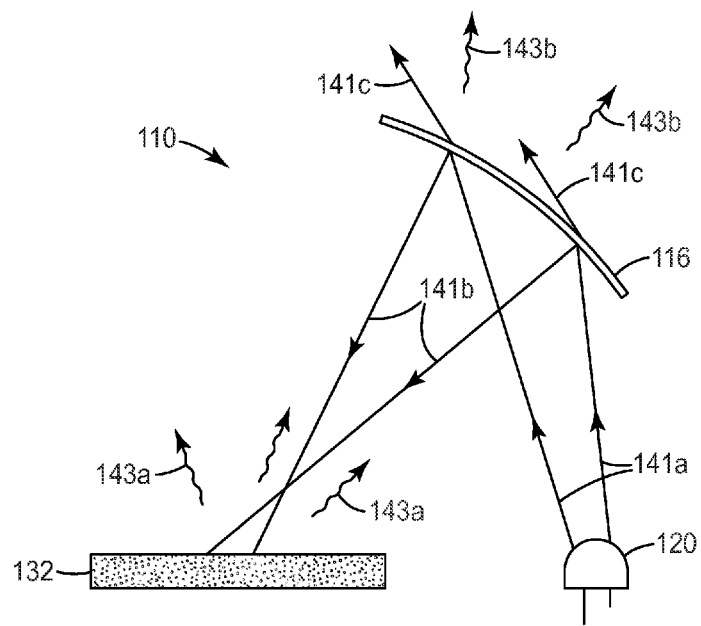
FIG. 1a is a schematic side or sectional view of a remote phosphor broadband light source that includes an LED, a dichroic reflector, and a phosphor layer.

As mentioned above, the present application describes, among other things, phosphor assemblies for use in broadband solid state light sources or systems, the light sources utilizing a layer of phosphor material that is pumped or excited by light from one or more solid state light emitting devices such as an LED. The phosphor assembly includes the phosphor layer attached to a broadband reflector. As LED light propagates from the LED to the phosphor assembly, it passes through the phosphor layer before reaching the broadband reflector. The broadband reflector provides high reflectivity, e.g. at least 90%, for both the LED light and the longer wavelength phosphor light. The output of the light source is broadband and includes at least a portion of the light emitted by the phosphor and at least a portion of the light emitted by the LED. The degree of transparency or transmission of the phosphor layer to LED light can be tailored, e.g. by appropriate selection of phosphor concentration and physical thickness of the phosphor layer, to increase the broadband light output of the lighting system. Such an increase in light output can actually be achieved by decreasing the amount of phosphor used in the phosphor layer. If desired, such an increase can also be achieved while maintaining a substantially white color of the broadband light output.

In some cases the sources may also include a dichroic reflector that reflects at least some of the light from the LED towards the phosphor assembly. In such cases, at least some of the LED light does not pass through the phosphor assembly or through the phosphor layer as it propagates from the LED to the dichroic reflector. However, the LED light reflected by the dichroic reflector then impinges on the phosphor layer, causing it to emit longer wavelength phosphor light. The phosphor light passes through the dichroic reflector to provide or contribute to the broadband output light of the light source. Some of the LED light, which is typically blue in color or of a similar short wavelength, may also pass through the dichroic reflector rather than being reflected so as to also contribute to the broadband output light of the light source.

In this regard, "light emitting diode" or "LED" refers to a diode that emits light, whether visible, ultraviolet, or infrared, although in many practical embodiments the emitted light will have a peak wavelength in a range from about 430 to 530 nm, or from about 440 to 500 nm, or from about 445 to 480 nm. The term LED includes incoherent encased or encapsulated semiconductor devices marketed as "LEDs", whether of the conventional or super radiant variety, as well as coherent semiconductor devices such as laser diodes, including but not limited to vertical cavity surface emitting lasers (VCSELs). An "LED die" is an LED in its most basic form, i.e., in the form of an individual component or chip made by semiconductor processing procedures. For example, the LED die may be formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can also be used, as well as inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant over an LED die and an associated reflector cup. The LED may be grown on one of several substrates. For example, GaN LEDs may be grown by epitaxy on sapphire, silicon, and gallium nitride. An "LED" for purposes of this application should also be considered to include organic light emitting diodes, commonly referred to as OLEDs.

In FIG. 1a, we see a schematic view of a remote phosphor broadband light source 110 that includes an LED 120, a dichroic reflector 116, and a layer 132 of phosphor material. The LED 120 emits light 141a of a relatively short wavelength, e.g., primarily blue light and/or ultraviolet light, although in some cases blue-green or green light may also be used. The light 141a may have one or more spectral emission peaks, including a primary or strongest emission peak, in a range from 400 to 500 nm. The LED light 141a propagates from the LED 120 to the dichroic reflector 116 without passing through the phosphor layer 132. The dichroic reflector 116 is configured, as discussed further below, to have a low absorption for substantially all optical wavelengths of interest, to have a high reflectivity (and low transmission) for short wavelength LED light, and to have a lower reflectivity (and higher transmission) for longer wavelength phosphor light. The LED light 141*a* is thus strongly reflected by the reflector 116 to produce reflected LED light 141*b*. The shape of the reflector 116, and the position of the LED 120 and of the phosphor layer 132, are selected so that the reflected LED light 141*b* impinges on the phosphor layer 132 as shown. The dichroic reflector 116 may transmit some of the LED light 141*a* to provide transmitted LED light 141*c*.

The phosphor layer 132 absorbs some or all of the incident LED light 141*b*, and re-emits some of the absorbed energy as Stokes shifted (longer wavelength) phosphor light 143*a*. The phosphor light 143*a* is typically emitted by the phosphor material in all directions, and such light is itself typically broadband as discussed further below. Some of the phosphor light 143*a* propagates towards the dichroic reflector 116. Such light is substantially transmitted by the reflector 116 to produce transmitted phosphor light 143*b*. The combination of the transmitted LED light 141*c* and the transmitted phosphor light 143*b* may produce the broadband output light of the source 110.

The dichroic reflector 116 may in some cases conform to the outer surface of a lens member, which is not shown in FIG. 1*a* for generality but is shown in other figures herein. The deflection of transmitted light rays 141*c* relative to respective light rays 141*a* represents the refraction of the LED light as it passes from the lens material into an air medium or similar low refractive index medium. The dichroic reflector 116 and the outer lens surface (if present) may thus have a concave and/or curved shape, so that the light emitted by the LED 120, and reflected by the reflector 116, is directed predominantly onto the phosphor layer 132. The dichroic reflector may be made to cover substantially all of the outer surface of the lens member, or it may cover at least 50%, 70%, or 80% of the area of the outer surface of the lens member.

Dichroic reflectors are also sometimes referred to as dichroic mirrors or dichroic filters. They are designed to have a high reflectivity and low transmission for some optical wavelengths, and a low reflectivity and high transmission for other optical wavelengths. Such reflectors ordinarily have negligible absorption, such that any light that is not reflected is substantially transmitted, and vice versa, at least over visible, near infrared, and near-ultraviolet wavelengths. Such reflectors comprise stacks of optically thin microlayers, typically in an alternating arrangement of materials having a large refractive index mismatch, such as alternating layers of silicon dioxide and titanium dioxide, but other suitable inorganic or organic materials may also be used. Such reflectors may be made by vacuum deposition of the alternating layers on a glass or other suitable substrate, e.g., directly on the outer surface of a lens member, or on a film or substrate that can be subsequently applied to such a surface. Alternatively, suitable reflective films may be made by a continuous process that may involve coextrusion of alternating polymer materials and stretching the resulting multilayer polymer web, e.g. as described in U.S. Pat. Nos. 5,882,774 and 6,783,349. Regardless of the materials used in the dichroic reflector and the method of manufacture used, the reflector is provided with a layer thickness profile for the stack of microlayers that is tailored to provide the desired reflection characteristics as a function of wavelength, as described elsewhere herein. Reference in this regard is made to U.S. Pat. No. 6,967,778. The thickness profile may be tailored to provide a dichroic reflector that operates as a long pass filter or a notch filter, for example, whereby relatively long wavelength phosphor light is substantially transmitted over a range of incidence angles, and relatively short wavelength LED light is predominantly reflected. The dichroic reflector may for example have a transmission of at least 50%, or at least 60%, or at least 70% for the phosphor light. The dichroic reflector may in some cases substantially reflect visible blue light and substantially transmit visible magenta light. In some cases the dichroic reflector may be or comprise a multilayer mirror film, a reflective polarizer, and/or a partially polarizing reflector such as a mirror that, at a given wavelength, reflects orthogonal polarization states differently.

The reflective and transmissive properties of a dichroic reflector typically change as the incidence angle of light impinging on the reflector changes. For example, the dichroic reflector 116 may have a greater transmission for LED light rays that are obliquely incident on the reflector compared to LED light rays that are normally incident on the reflector. This characteristic may be used to produce a remote phosphor solid state light source whose output color can be adjusted by controlling the relative drive strengths of multiple LEDs arranged beneath the lens assembly, as discussed more fully in commonly assigned pending U.S. patent application 61/487,423, filed May 18, 2011.

The phosphor layer 132 contains one or more suitable phosphor materials that fluoresce or otherwise emit light that is Stokes shifted relative to the absorbed LED light. The phosphor material preferably absorbs light in a range that overlaps in wavelength with the emission spectrum of the LED, such that the LED can excite the phosphor and cause it to fluoresce or otherwise emit phosphor light. In many cases, a given phosphor material may absorb light in the ultraviolet, blue, and/or blue-green portion of the electromagnetic spectrum, and may emit light in the visible or near-visible region. The emitted phosphor light is typically broadband, e.g., it may have a spectral width of at least 100 nanometers. The broadband phosphor light may be distributed in a continuous broad band, or it may have a spiked distribution as in the case of a collection of spaced-apart narrow emission lines, or it may be a combination of narrow emission lines and a continuous broad band. Exemplary phosphor materials include known fluorescent dyes and phosphors. Cerium-doped yttrium aluminum garnet (Ce:YAG) is one example of a phosphor that may be used. Other rare-earth doped garnets or other rare-earth doped materials may also be suitable, e.g., europium- and/or strontium-doped silicates, nitrides, and aluminates, depending on design details and constraints of the light source. Suitable phosphor materials may include organic and inorganic fluorescent or phosphorescent materials, such as doped inorganic oxides or nitrides, quantum dots, and semiconductors including II-VI and III-V materials.

Figure 1B:
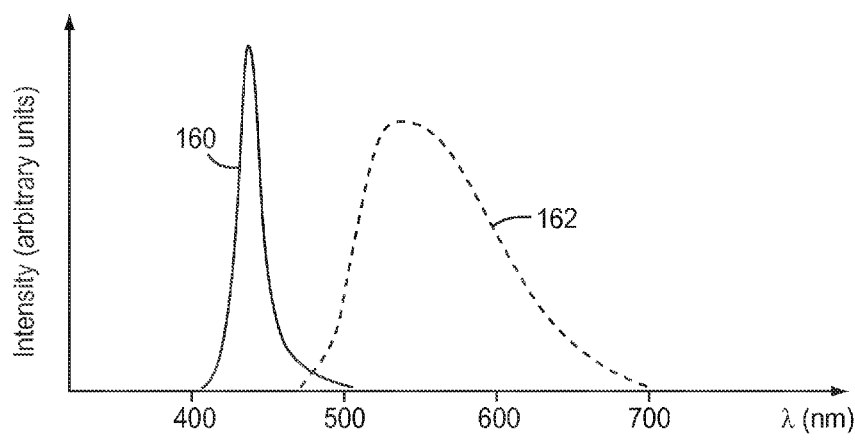
FIG. 1b is an idealized graph of the spectral intensity distributions of an exemplary blue LED and an exemplary phosphor.

A typical phosphor light emission spectrum is depicted in FIG. 1*b* as curve 162. Also shown is a typical blue LED emission spectrum, labeled as curve 160. These curves are meant to be representative of typical components, and are not necessarily intended to be limiting. As shown in the figure, for a given LED/phosphor pair, the phosphor light is generally distributed at longer wavelengths than the LED light. In cases where the LED 120 emits blue light, and where the dichroic reflector 116 transmits some of this light, the phosphor layer 132 can be tailored to emit yellow phosphor light, so that the combination of the blue LED light and yellow phosphor light provides nominally white light.

Figure 2:
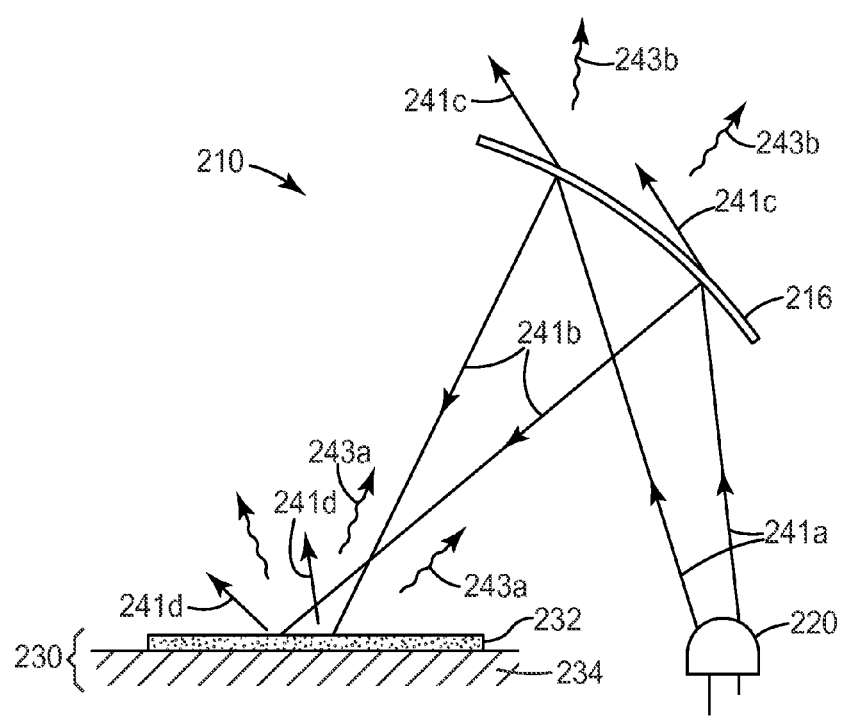
FIG. 2 is a schematic side or sectional view of a remote phosphor broadband light source that includes an LED, a dichroic reflector, and a phosphor assembly.

FIG. 2 shows a schematic view of a remote phosphor broadband light source 210 that may be the same as or similar to the source 110 of FIG. 1*a*, except that the simple phosphor layer 132 is replaced by a phosphor mirror assembly 230. The light source 210 thus includes an LED 220, a dichroic reflector 216, and a phosphor mirror assembly 230. The LED 220 emits light 241a of a relatively short wavelength, e.g., primarily blue light and/or ultraviolet light, although in some cases blue-green or green light may also be used. The light 241a may have one or more spectral emission peaks, including a primary or strongest emission peak, in a range from 400 to 500 nm. The LED light 241a propagates from the LED 220 to the dichroic reflector 216 without passing through the phosphor layer 232. The dichroic reflector 216 is configured, as discussed elsewhere herein, to have a low absorption for substantially all optical wavelengths of interest, to have a high reflectivity (and low transmission) for short wavelength LED light, and to have a lower reflectivity (and higher transmission) for longer wavelength phosphor light. The LED light 241a is thus strongly reflected by the reflector 216 to produce reflected LED light 241b. The shape of the reflector 216, and the position of the LED 220 and of the phosphor assembly 230, are selected so that the reflected LED light 241b impinges on the phosphor assembly 230 as shown. The dichroic reflector 216 may transmit some of the LED light 241a to provide transmitted LED light 241c.

The phosphor assembly 230 includes a layer 232 of phosphor material attached to a broadband reflector 234. The phosphor layer 232 may be the same as or similar to the phosphor layer 132 of FIG. 1a, except that the layer 232 may be physically and/or optically thinner than the layer 132. For example, the layer 232 may have the same concentration of phosphor material per unit volume as the layer 132 but may be physically thinner, to ensure that some of the LED light 241b is able to penetrate entirely through the phosphor layer 232. Alternatively, the layer 232 may have the same physical thickness as that of layer 132, but may have a lower concentration of phosphor material per unit volume than layer 132, again to ensure that some of the LED light 241b is able to penetrate entirely through the phosphor layer 232. In other cases, the layer 232 may be both physically thinner and have a lower phosphor concentration than layer 132. In any case, some of the LED light 241b is incident on the phosphor layer 232, and some of that light is absorbed and re-emitted as phosphor light 243a. The remainder of the LED light 241b reaches the broadband reflector 234, and is reflected back into the phosphor layer 232. Some of this doubly-reflected LED light is again absorbed and re-emitted by the phosphor layer 232, and the remainder emerges from the layer 232 and from the assembly 230 as reflected LED light 241d. Some of the phosphor light 243a, and some of the doubly reflected LED light 241d, may propagate towards the dichroic reflector 216. The phosphor light 243a is substantially transmitted by the reflector 216 to produce transmitted phosphor light 243b. Some of the doubly reflected LED light 241d may also be transmitted by the reflector 216 to increase the amount of transmitted LED light 241c. The combination of the transmitted LED light 241c and the transmitted phosphor light 243b may produce the broadband output light of the source 210. In cases where the LED 220 emits blue light, and where the dichroic reflector 216 transmits some of this light, the phosphor layer 232 can be tailored to emit yellow phosphor light, so that the combination of the blue LED light and yellow phosphor light provides nominally white light.

Figure 3A:
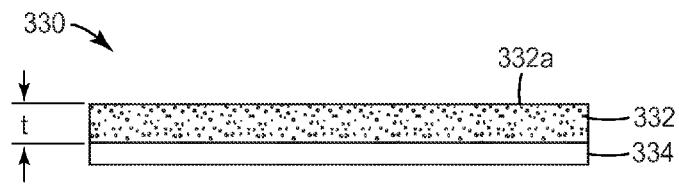
FIGS. 3a and 3b are schematic side or sectional views of exemplary phosphor assemblies.
Figure 3B:
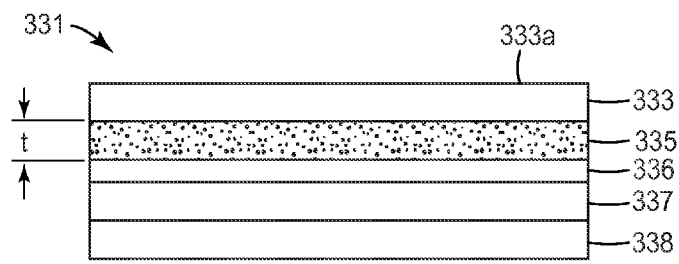

The phosphor assembly may contain as few as two layers—a phosphor layer and a broadband reflector layer—or it may contain additional layers. For example, the phosphor assembly may contain one or more adhesive layers, spacer layers, structural layers, thermally conductive layers, bonding layers, and release liners. A wide variety of different constructions for the phosphor assembly are contemplated. FIGS. 3a and 3b schematically depict two such constructions.

In FIG. 3a, a phosphor assembly 330 of fairly simple design comprises a phosphor layer 332 attached to a broadband reflector 334. In FIG. 3b, a phosphor assembly 331 of more complex design comprises a phosphor layer 332 attached to a broadband reflector 336, the assembly further comprising an adhesive layer 333, a structural layer 337, and a thermally conductive layer 338. The thermally conductive layer 338 can be attached to a heat sink to help maintain the phosphor layer 335 at a lower operating temperature. Preferably, light enters and exits a given phosphor assembly through the same surface, referred to here as the "working surface" of the phosphor assembly. In FIG. 3a, the working surface is surface 332a, and in FIG. 3b, the working surface is surface 333a. Although the broadband reflector is shown in FIGS. 3a and 3b as being attached directly to the phosphor layer, in other cases, the broadband reflector may attach to the phosphor layer through one or more intermediate layers. One design parameter of the phosphor assembly that may be significant, as described elsewhere herein, is the physical thickness of the phosphor layers 332, 333, which is labeled "t" in FIGS. 3a and 3b. Another design parameter of the phosphor assembly that may be significant is the concentration of phosphor material in the phosphor layer. Some of the constituent layers that may be included in a phosphor mirror assembly will now be discussed in more detail.

The phosphor layer of the phosphor assembly may be made from a photo-stable and thermally-stable binder with one or more phosphors dispersed therein. The binder may be a polymer, including for example silicone and/or fluoropolymers, and may be an adhesive or gel, such as a silicone adhesive or a silicone gel. The phosphor materials (phosphors) may be mixed, layered, or patterned, or a combination of two or more of these configurations. Suitable means of coating include knife coating, extrusion coating, and bar coating. Suitable means for applying a patterned coating include those used for printing, including rotogravure, intaglio, silk screen, and ink jet. One or more phosphor layers may be patterned on an unpatterned layer of a phosphor, or different areas may have predominantly one phosphor type. For example, a pixel pattern of a red-emitting phosphor and a green-emitting phosphor may be used, where each pixel is about the size of an associated LED (that drives or excites the phosphor) in at least one direction. The pixel pattern may be in the form of one-dimensional rows or a two-dimensional grid. Reabsorption losses can be reduced by spatially separating the different phosphors. The different phosphors may in some cases be separated into regions whose lateral or transverse dimension is in a range from about 2 to 20 times the thickness of the phosphor containing layer.

The broadband reflector of the phosphor assembly has a high reflectivity for both the relatively short wavelength LED light and the longer wavelength phosphor light. Thus, any LED light that propagates entirely through the phosphor layer may be reflected back into the phosphor layer to allow for increased absorption of the LED light in a phosphor layer of reduced thickness. Furthermore, any phosphor light that propagates in directions away from the output end of the broadband light source (and away from the working surface of the phosphor assembly) can be intercepted by the broadband reflector and redirected back through the phosphor layer so as to increase the phosphor light component of the overall output of the light source. The broadband reflector may be or comprise a specular reflector, a diffuse reflector, and/or a semi-specular reflector (combination of specular and diffuse). The broadband reflector may comprise a binder and a pigment, and may contain other additives. Suitable binders include the same binder materials as those mentioned in connection with the phosphor layer. The binder used in the broadband reflector may be the same as or different from the binder used in the phosphor layer. Exemplary pigments include anatase or rutile $TiO_2$. Preferably, the $TiO_2$ is passivated with a coating such as silica. Other additives can include an inorganic filler to improve thermal conductivity. Suitable fillers may include alumina, aluminum nitride, boron nitride, and/or diamond. Such fillers in the broadband reflector desirably have a low absorbance of LED light and phosphor light. Suitable broadband reflectors with predominantly specular characteristics include multilayer optical films configured for high reflectivity across the visible spectrum, such as Vikuiti™ Enhanced Specular Reflector Film (ESR) marketed by 3M Company, which has greater than 98% reflectivity over the visible region. Other dielectric coating reflectors, made from optically thin layers of high and low index materials, such as nanovoided polymers or other polymers, $MgF_2$, $TiO_2$, $SiO_2$, $Al_2O_3$, and/or $ZrO_2$, may also be used. Simpler metal-coated films, such as aluminum-coated polymer films or silver-coated polymer films, may also be used. The reflectivity of a metal coating may be enhanced by, for example, adding one or more known dielectric coatings such as nanovoided polymers or other polymers, inorganic nanoparticulate filled polymers, $MgF_2$, $TiO_2$, $SiO_2$, $Al_2O_3$, and/or $ZrO_2$.

An adhesive layer may also be included in the phosphor assembly. The adhesive layer preferably has high transmission and low absorption for both LED light and phosphor light. Suitable adhesive layers include acrylates and silicones. The adhesives may contain other additives that can be cured with heat or radiation. For example, a thermally cured epoxy may be mixed with a B-staged cured acrylate to form a pressure sensitive adhesive that can be cured to form a permanent bond. The adhesive may also be applied as a curable liquid, such as a silicone resin monomer with a thermally or photolytically activated catalyst. In some cases, the adhesive may provide a substantially permanent bond between the phosphor layer and another component of the light source such as a lens member. In other cases, the adhesive may provide a removable bond. In this regard, the adhesive may have a bond strength that is high enough to provide good durability in the final application, but also low enough to allow one or more portions of the phosphor layer to be removed e.g. by die-cutting and peeling.

A transparent spacer layer may also be included in the phosphor assembly. Such layer may be disposed at the working surface of the assembly, or otherwise between the working surface and the phosphor layer. The spacer layer may be tailored to serve one or more of the following functions: it may change the optical output characteristics of the light emitted from the phosphor layer; it may displace or position the phosphor layer away from one component, such as a lens member, and closer to another component, such as a thermally conductive substrate; and/or it may provide a low refractive index layer between a lens member and the phosphor layer in order to increase the brightness of the device. Suitable low index coatings include fluoropolymers, silicones, and radiation curable materials that are cured in combination with a solvent, then dried to produce a low index layer.

A structural layer may also be included in the phosphor assembly. The structural layer in this regard refers to a layer that is self-supporting and sufficiently thick and strong so that it can be mechanically removed (e.g. by peeling) along with portion(s) of the phosphor layer to which it is adhered. Before removal, the structural layer may be scored or cut to separate portion(s) to be retained from portion(s) to be removed, whereupon the portion(s) to be removed can be mechanically removed from a lens member or other component along with corresponding portion(s) of the phosphor layer so as to selectively expose portion(s) of the inner surface of the lens member. Suitable structural layers include polyesters, including polyethylene terephthalate or polyethylene naphthalate, fluoropolymers, polyethylene, polypropylene, and silicones. The structural layer may also be of a woven or random fibrous mat including materials such as cellulose, synthetic fibers, and ceramic or glass fibers.

A thermally conductive layer may also be included in the phosphor assembly. The thermally conductive layer may be disposed behind the phosphor layer, such that the phosphor layer lies between the thermally conductive layer and the working surface of the assembly. The thermally conductive layer may contact or otherwise couple to a thermally conductive substrate or heat sink so as to maintain the phosphor layer at a lower operating temperature. The thermally conductive layer may be made from polymer layers, particularly those filled with adequate amounts of thermally conductive powder(s) or material(s) such as alumina, silica, boron nitride, and/or aluminum nitride. The polymer layer may be a homopolymer such as a silicone or an acrylate, or a mixture of polymers, or a B-stage curable material such as a mixture of a thermally cured epoxy with a radiation cured acrylate.

A bonding layer (other than the adhesive layer 525 already discussed) may also be included in the phosphor assembly. For example, a primer layer may be included between adjacent functional layers so as to enhance bonding between such layers.

The functions of two or more layers in the sandwich construction of the phosphor assembly may be combined into a single layer. For example, an adhesive layer may also serve as a transparent spacer layer. Alternatively or in addition, any of the layers described or depicted as a single layer can be split or duplicated so as to provide two or more such distinct layers within the sandwich construction of the phosphor assembly. Furthermore, the phosphor assembly may be made in roll form, e.g. using a polymeric base film or films, and then pieces of suitable size and shape may be cut from the roll for incorporation into a particular remote phosphor lighting system. The assembly may thus be made to be die-cuttable.

Figure 4:
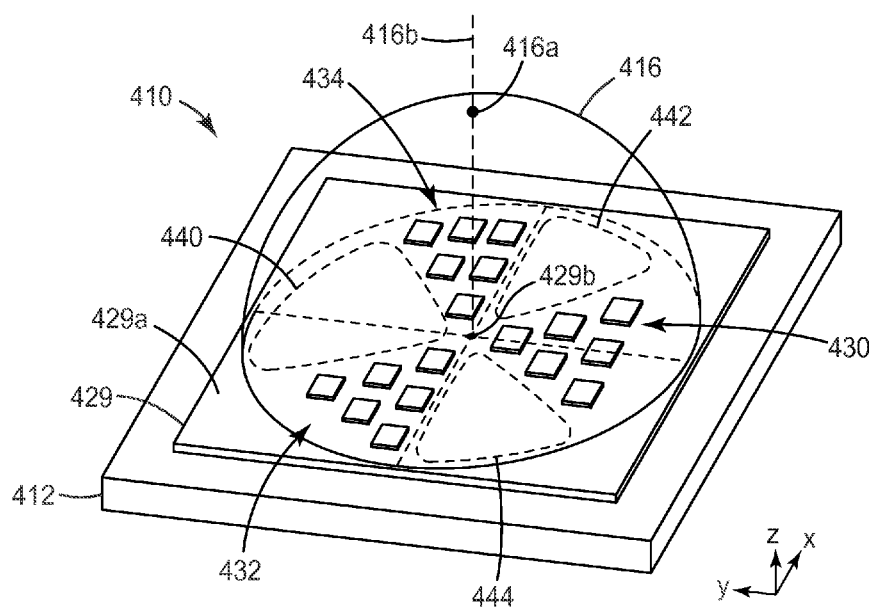
FIG. 4 is a schematic perspective view of another exemplary broadband light source.

FIG. 4 shows a broadband light source 410 that incorporates a phosphor assembly 429. The light source 410 is shown in the context of a Cartesian x-y-z coordinate system. The light source 410 includes a substrate 412, which may be or comprise a heat sink. The substrate 412 carries the phosphor assembly 429, which has an upper (working) surface 429a and a reference point 429b. The phosphor assembly 429 contains a phosphor layer and a broadband reflector, but may also contain other layers and features as described elsewhere herein. Eighteen LEDs are disposed atop or otherwise proximate the phosphor assembly, the LEDs being arranged in three wedge-shaped groups 430, 432, 434 of six neighboring LEDs, each group of neighboring LEDs disposed in a wedge-shaped region of the substrate. The layout of the three wedge-shaped groups of LEDs, and the depicted number and orientation of LEDs in each group, is one of many possible arrangements, and should not be construed in a limiting way. For example, shapes other than wedge-like shapes are also contemplated. The LEDs may also be arranged in other configurations besides three wedges, and there may be one or more LEDs suitably positioned such that most of the light from each LED preferentially illuminates an unobstructed area of phosphor, as discussed below. The LEDs may be encapsulated in a clear polymer or glass, or other suitable light-transmissive material, which forms a lens member, or the LEDs may be disposed directly underneath a lower or inner surface of the lens member. An upper or outer surface of the lens member may be concave and curved such that a dichroic reflector 416 can be applied and can shapingly conform to such surface. The dichroic reflector may be the same as or similar to the other dichroic reflectors described herein. The shape of the dichroic reflector 416 may define an apex 416a and a symmetry axis or optical axis 416b. The optical axis 416b may coincide with an optical axis of the source 410, and may pass through the reference point 429b and the apex 416a.

The groups of neighboring LEDs are separated from each other by unobstructed wedge-shaped portions 440, 442, 444 of the phosphor assembly 429. "Unobstructed" in this regard refers to a portion of the phosphor assembly 429 in which substantially no LEDs are present. Further, each group of neighboring LEDs resides in a wedge-shaped region of the substrate that is generally opposite one of the unobstructed wedge-shaped portions of the phosphor assembly, from the perspective of the point 429b. Each pair of a wedge-shaped region of the substrate (e.g., the region in which wedge-shaped group 430 of LEDs resides) and its corresponding wedge-shaped portion of the phosphor assembly (e.g., the portion 440) may also be generally symmetrical with respect to the point 429b. By configuring the dichroic reflector 416 such that the optical axis 416b passes through the point 429b, and by selecting a suitable radius of curvature of the dichroic reflector, the portion of LED light from each wedge-shaped group of neighboring LEDs that is reflected by the dichroic reflector can be imaged (at least approximately) onto its corresponding wedge-shaped portion of the phosphor assembly.

In the vicinity of the unobstructed portions 440, 442, 444, the phosphor assembly may be directly adhered to the bottom or inner surface of the lens member, which inner surface may be substantially flat. Also, in an alternative embodiment, the phosphor assembly may be cut (e.g. die cut) into three wedge-shaped pieces that are aligned with the three unobstructed portions 440, 442, 444 and that may be bonded to the inner surface of the lens element. In such a case, no phosphor assembly may be present beneath the LEDs, and the LEDs may contact the substrate 412 directly.

The neighboring LEDs in each of the three LED groups are arranged at different radial distances (measured parallel to the x-y plane) from the point 429b and/or the optical axis 416b. In the depicted arrangement, for example, one LED in each group is disposed closest to the axis 416b, three LEDs in each group are disposed farthest from the axis 416b, and two LEDs in each group are disposed at an intermediate distance from the axis 416b. If desired, such an arrangement of LEDs can be used, in combination with a dichroic reflector 416 whose reflective and transmissive properties change as a function of incidence angle, to adjust or control the color of the broadband output of the source 410. The output color can be adjusted by controlling the relative drive strengths of the various LEDs arranged beneath the lens member, as discussed more fully in commonly assigned pending U.S. patent application 61/487,423, filed May 18, 2011.

Figure 5:
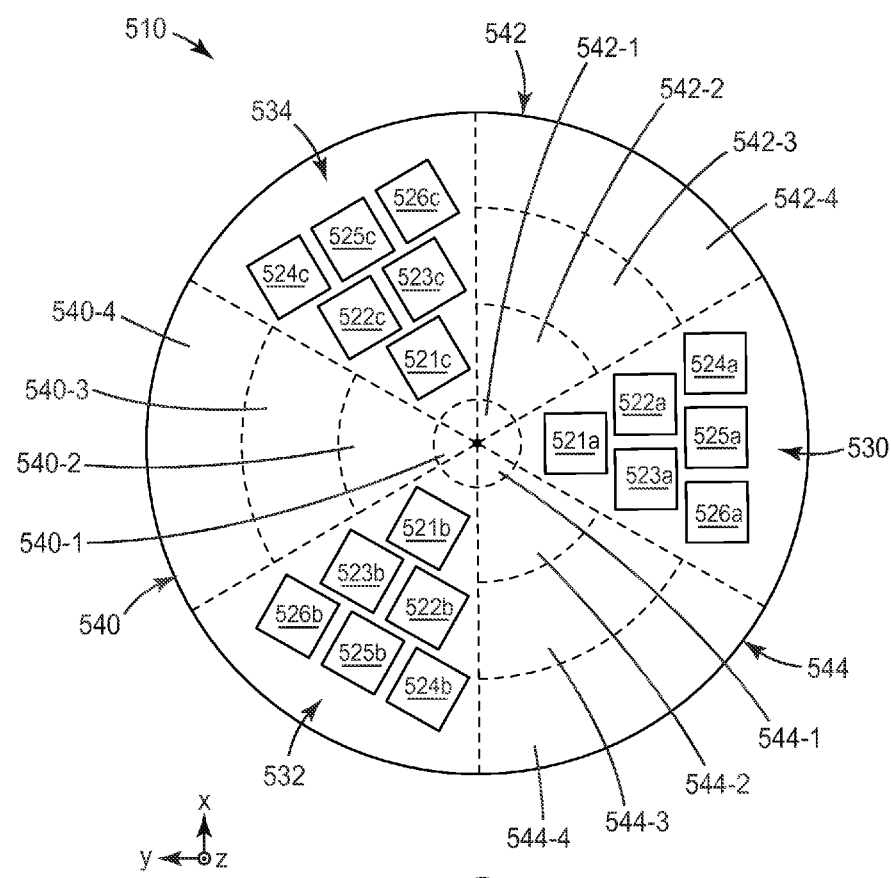
FIG. 5 is a schematic top or plan view of a portion of a broadband light source.

FIG. 5 shows a schematic top or plan view of a portion of a broadband light source 510, which may be the same as or similar to light source 410. In the source 510, which is drawn relative to a Cartesian x-y-z coordinate system, a phosphor assembly and/or a substrate is partitioned into six wedge-shaped regions or portions, opposed pairs of which may be substantially congruent to each other. The phosphor assembly may be the same as or similar to phosphor assemblies described elsewhere herein. Eighteen LEDs are arranged on the substrate or phosphor assembly in a manner similar to that shown in FIG. 4, i.e., in three wedge-shaped groups 530, 532, 534 of six neighboring LEDs, each group of neighboring LEDs disposed in one of the wedge-shaped regions of the substrate. Each of these groups of LEDs is arranged opposite an unobstructed wedge-shaped portion of the phosphor assembly, from the perspective of the central point (not labeled) shown in the center of the device. Thus, LED group 530 is arranged opposite wedge-shaped phosphor assembly portion 540, LED group 532 is arranged opposite wedge-shaped phosphor assembly portion 542, and LED group 534 is arranged opposite wedge-shaped phosphor assembly portion 544. In exemplary embodiments, a concave dichroic reflector is provided to partially or completely cover the portion of the light source depicted in FIG. 5. The dichroic reflector, which may be the same as or similar to dichroic reflectors discussed elsewhere herein, may be disposed on a surface of a light-transmissive encapsulant or lens member, and may have a symmetry axis or optical axis parallel to the z-axis and passing through the central point (not labeled). Such a reflector can reflect at least some light from the various LEDs onto selected portions of the phosphor assembly so that the different LEDs primarily excite different portions of the phosphor layer in the phosphor assembly. If we consider the phosphor assembly portions 540, 542, 544 as comprising subportions at different radial distances from the central point, i.e. portion 540 comprising subportions 540-1, 540-2, 540-3, 540-4, portion 542 comprising subportions 542-1, 542-2, 542-3, 542-4, and portion 544 comprising subportions 544-1, 544-2, 544-3, 544-4, the dichroic reflector may reflect LED light from the various LEDs preferentially onto the various phosphor assembly subportions as follows:

light from LED 521a onto phosphor subportion 540-2;
light from LEDs 522a, 523a onto phosphor subportion 540-3;
light from LEDs 524a, 525a, 526a onto phosphor subportion 540-4;
light from LED 521b onto phosphor subportion 542-2;
light from LEDs 522b, 523b onto phosphor subportion 542-3;
light from LEDs 524b, 525b, 526b onto phosphor subportion 542-4;
light from LED 521c onto phosphor subportion 544-2;
light from LEDs 522c, 523c onto phosphor subportion 544-3; and
light from LEDs 524c, 525c, 526c onto phosphor subportion 544-4.

The reader will keep in mind that the preferential reflection of LED light should not be so narrowly construed as to require all of the reflected LED light from a given LED to impinge on the specified phosphor subportion, and that some reflected LED light from such LED may also impinge on other phosphor subportions and/or on other LEDs or other elements of the source.

In one embodiment of the light source 510, all eighteen LEDs may emit LED light according to a same LED emission spectrum, and the phosphor layer may be of uniform composition and structure such that the composition and structure of the phosphor layer is the same throughout and amongst the wedge-shaped portions 540, 542, 544. The color of the overall broadband light emission from the source 510 may be controlled or adjusted by controlling the relative degree to which the subgroups of near, intermediate, and far LEDs are energized. In another embodiment of the light source 510, different colors can be achieved for different broadband light portions by using different compositions and/or structures for portions of the phosphor assembly associated with different LEDs. For example, the wedge-shaped portion 540 of the phosphor assembly, which is excited by the six LEDs of LED group 530, may have a different composition and/or structure than the phosphor assemblies of portions 542 and/or 544. The color of the overall broadband light emission from the source may then be controlled or adjusted by controlling or adjusting the relative degree to which one group of neighboring LEDs (e.g. LED group 530) is energized compared to the other groups of neighboring LEDs (e.g. LED groups 532, 534). Additionally or in the alternative, one, some, or all of the wedge-shaped portions 540, 542, 544 of the phosphor assembly may have a composition and/or structure that is different at different radial distances from the optical axis of the dichroic reflector or the central point (not labeled). Because of the imaging properties of the concave dichroic reflector, the subgroup of one near LED in each group of neighboring LEDs tends to preferentially excite the portion of the wedge-shaped phosphor assembly portion nearest the central point, and the subgroup of two intermediate LEDs in each group of neighboring LEDs tends to preferentially excite a middle portion of the wedge-shaped phosphor assembly portion, and the subgroup of three far LEDs in each group of neighboring LEDs tends to preferentially excite the portion of the wedge-shaped phosphor assembly portion farthest the central point. A radially-varying phosphor layer can therefore be used to control or adjust the color temperature of the overall broadband light emission from the source 510 by adjusting or controlling the relative degree to which the subgroups of near LEDs, intermediate LEDs, and far LEDs are energized. In still another embodiment of the light source 510, different colors can be achieved for different broadband light portions by selecting individual LEDs that have different emission spectra, and then controlling or adjusting the relative degree to which LEDs of different emission properties are energized.

Figure 6:
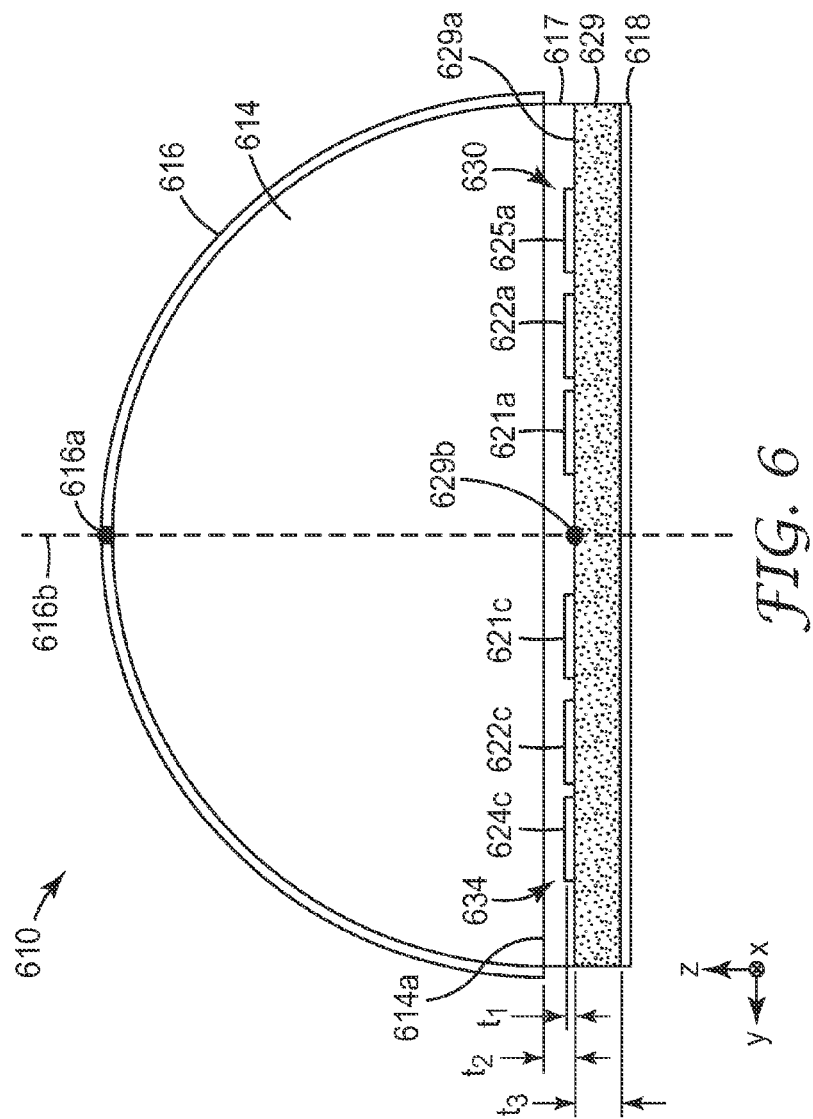
FIG. 6 is a schematic side or sectional view of another exemplary broadband light source, showing a phosphor assembly.

FIG. 6 is a schematic side or sectional view of another exemplary broadband light source 610, which may be the same as or similar to the light sources 410 and 510. In the source 610, which is drawn relative to a Cartesian x-y-z coordinate system, LEDs 621a, 622a, 625a, 621c, 622c, 624c are disposed on a major surface 629a of a phosphor layer 629, which in turn is disposed on a reflective substrate 618. The phosphor layer 629 and the reflective substrate 618, which strongly reflects both LED light and phosphor light, form a phosphor assembly. The LEDs are encapsulated in a first encapsulating member 617, atop which is formed a second encapsulating member or lens member 614. The first and second encapsulating members may be composed of different light-transmissive materials, e.g., different transparent polymer materials, but in other embodiments the first and second encapsulating members may be made of the same material such that the members form a unitary component. The second member 614 is shown to have a flat lower or inner surface 614a in contact with the first member 617. The second member also has a curved upper or outer surface on which is formed a dichroic reflector 616. The concave shape of the curved outer surface, and of the dichroic reflector 616, define a symmetry axis or optical axis 616b, which passes through an apex 616a of the dichroic reflector and through a central point 629b on the surface 629a of the phosphor layer 629.

The first member 617 may be or comprise a layer of adhesive, optionally bonded to the inner surface 614a and filling the space between surface 614a and 629a. Member 617 may also be or comprise a low refractive index material such as a polymer layer containing gas-filled voids, the voids having a diameter in a range from about 50 to about 400 nm. The voided polymer may be made by curing a monomer containing a solvent, and removing the solvent after curing. Reference is made, for example, to PCT publication WO 2011/0881661. In other embodiments, member 617 may be or comprise an air-filled gap between the surfaces 614a and 629a.

The view of FIG. 6 does not provide complete information regarding the arrangement or layout of the LEDs on the surface 629a. In one embodiment, the LEDs can be grouped together in wedge-shaped regions similar to those shown in FIGS. 4 and 5. For example, LEDs 621a, 622a, 625a may be three LEDs in a group of six neighboring LEDs similar to LEDs 521a, 522a, 523a, 524a, 525a, 526a in FIG. 5, and LEDs 621c, 622c, 624c may be three LEDs out of a group of six neighboring LEDs similar to LEDs 521c, 522c, 523c, 524c, 525c, 526c in FIG. 5. Alternatively, the LEDs may be positioned on the surface 629a in any other arrangement, either in groups of neighboring LEDs, or in a dispersed or spaced-apart arrangement, or in a combination of neighboring and dispersed LEDs, such that light from a given LED is reflected by the dichroic reflector 616 onto a portion of the phosphor surface 629a that is not substantially occluded by other LEDs. In any case, as light propagates from one, some, or all of the LEDs to the dichroic reflector, it does not pass through the phosphor layer. The LEDs may be connected to a controller by lead lines, wire bonds, or other conductive elements that are not shown for simplicity.

The phosphor layer may be the same as or similar to phosphor layers described elsewhere herein, and it may comprise one or more phosphor materials described elsewhere herein. In one embodiment, the phosphor layer may be or comprise a layer of transparent polymer in which a multitude of phosphor particles are dispersed. The phosphor layer 629 is assumed to have a thickness t3 that is small enough so that the layer 629 is partially light-transmissive, such that at least some reflected LED light propagates completely through the layer 629 and strikes the reflective substrate 618. The LED light reflected by the reflective substrate may then propagate back through the phosphor layer 629, for another opportunity to be absorbed by a phosphor material.

The source 610 may be configured to provide an overall broadband light emission that is made up of a plurality of broadband light portions having different colors, using any of the techniques discussed herein or in the commonly assigned U.S. patent application No. 61/487,423 referenced elsewhere herein.

Figure 7:
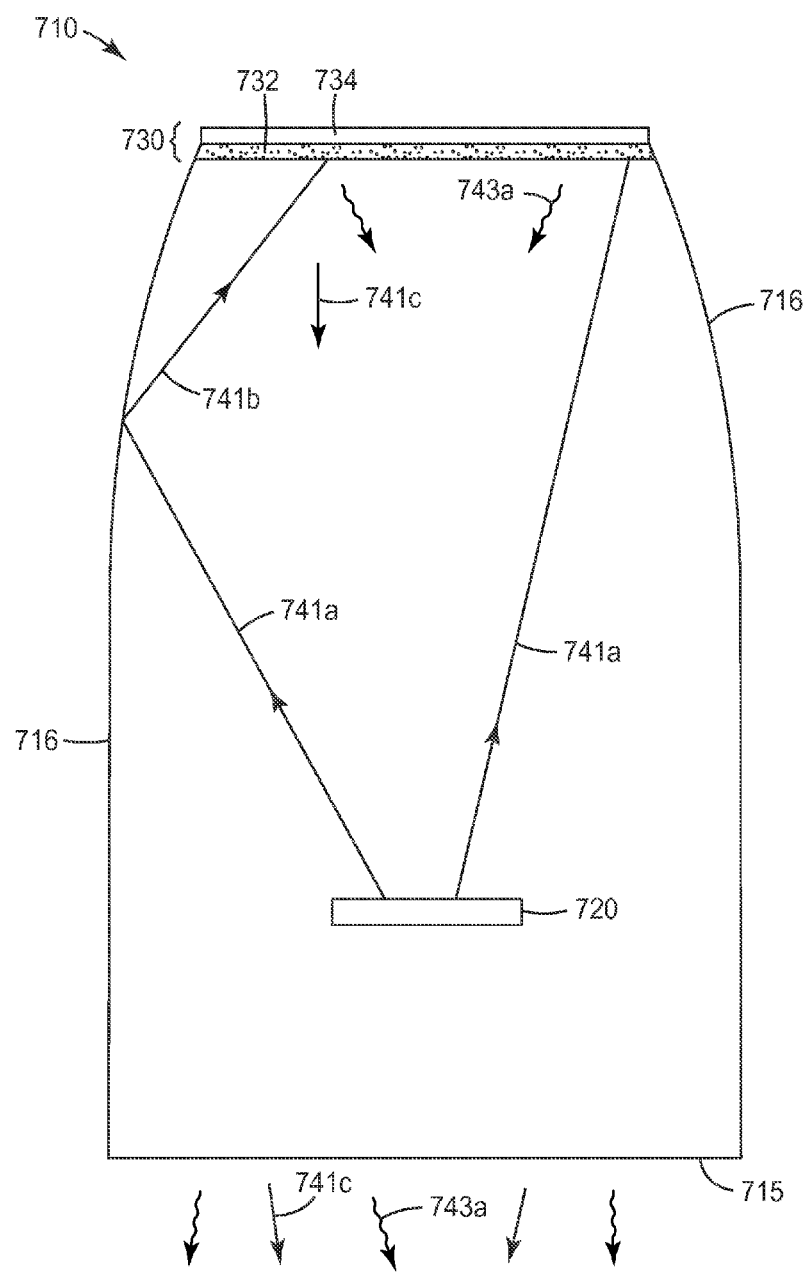
FIG. 7 is a schematic side or sectional view of another remote phosphor broadband light source that includes an LED and a phosphor assembly.

FIG. 7 shows a schematic view of an alternative remote phosphor broadband light source 710. The source 710 emits broadband light, such as white light, from an output aperture or surface 715. The source 710 includes an LED 720, a reflector 716, and a phosphor mirror assembly 730. The LED 720 emits light 741a of a relatively short wavelength as discussed elsewhere herein. The LED 720 may be held in position using any suitable support structure (not shown) such as a light-transmissive substrate or one or more support beams connecting it to the reflector 716. Some of the LED light may be reflected by the reflector 716 (see light 741b) before striking the phosphor assembly 730, while other LED light may travel directly to the phosphor assembly 730. The reflector 716 may have any desired level of reflectivity, but preferably it has a high reflectivity for both LED light and phosphor light. The reflector 716 may be or comprise a specular reflector, a diffuse reflector, and/or a semi-specular reflector (combination of specular and diffuse). In some cases, the reflector 716 may be the same as or similar to any of the broadband reflectors described herein. In some cases, the LED 720 may be bidirectional such that it emits some LED light generally towards the phosphor assembly 730, and other LED light generally towards the output surface 715.

The phosphor assembly 730 may be the same as or similar to other phosphor mirror assemblies described herein. As such, the assembly 730 includes at least a layer 732 of phosphor material attached to a broadband reflector 734. Some of the LED light, whether directly, or indirectly by reflection from reflector 716, impinges on the phosphor layer 732, and some of that light is absorbed and re-emitted as phosphor light 743a. The remainder of the LED light that impinges on the phosphor layer 732 reaches the broadband reflector 734, and is reflected back into the phosphor layer 732. Some of this reflected LED light is again absorbed and re-emitted by the phosphor layer 732, and the remainder emerges from the layer 732 and from the assembly 730 as reflected LED light 741c. Some of the phosphor light 743a, and some of the reflected LED light 741c, emerges from the output surface 715 of the source 710 after zero, or one, or more reflections from the reflector 716. The emerging LED light and the emerging phosphor light combine to provide the broadband output light of the source 710. In cases where the LED 720 emits blue light, the phosphor layer 732 can be tailored to emit yellow phosphor light, so that the combination of the blue LED light and yellow phosphor light provides nominally white light.

Figure 12:
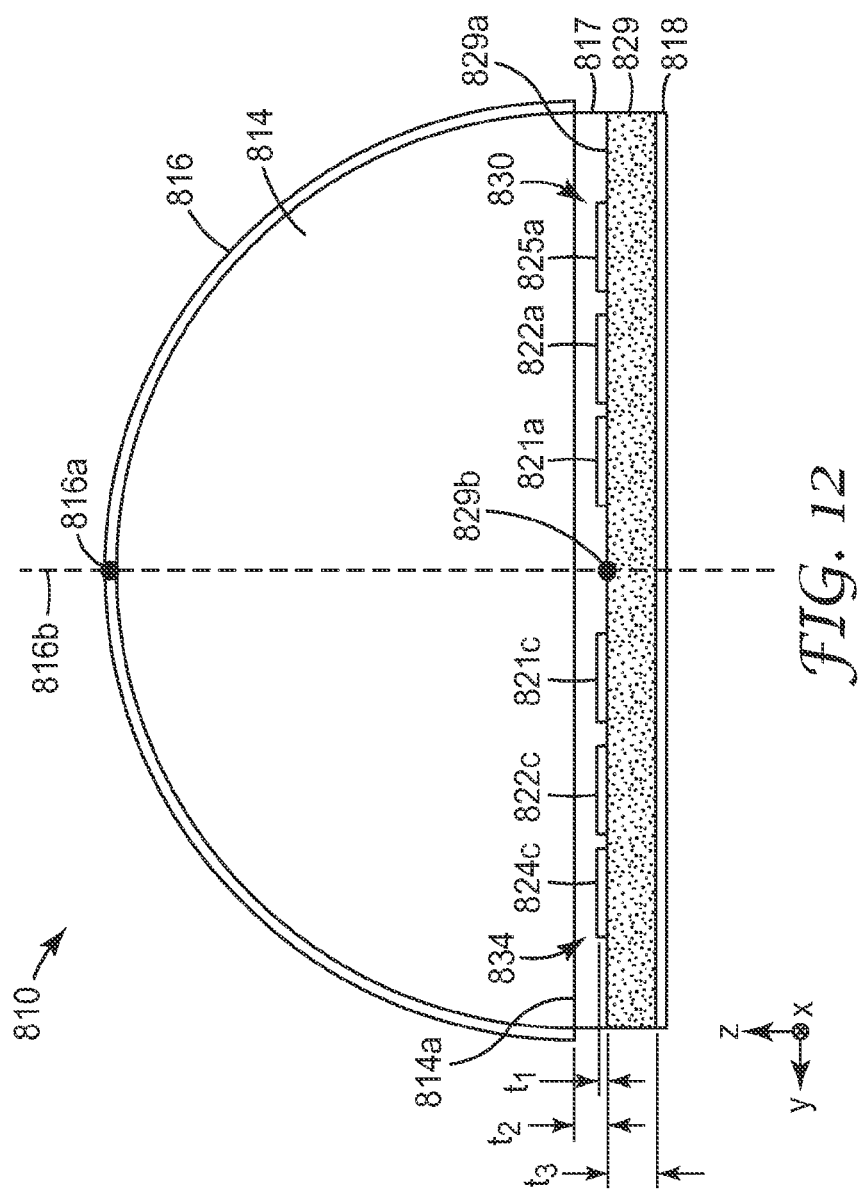
FIG. 12 is a schematic side or sectional view of another exemplary broadband light source, showing a phosphor assembly.

FIG. 12 is a schematic side or sectional view of another exemplary broadband light source 810, which efficiently provides a warm white light output. In the source 810, which is drawn relative to a Cartesian x-y-z coordinate system, LEDs 821a, 822a, 825a, 821c, 822c, 824c are disposed on a major surface 829a of a phosphor layer 829, which in turn is disposed on a reflective substrate 818. The phosphor layer 829 and the reflective substrate 818, which strongly reflects both LED light and phosphor light, form a phosphor assembly. The LEDs are encapsulated in a first encapsulating member 817, atop which is formed a second encapsulating member or lens member 814. The first and second encapsulating members may be composed of different light-transmissive materials, e.g., different transparent polymer materials, but in other embodiments the first and second encapsulating members may be made of the same material such that the members form a unitary component. The second member 814 is shown to have a flat lower or inner surface 814a in contact with the first member 817. The second member also has a curved upper or outer surface on which is formed a dichroic reflector 816. The concave shape of the curved outer surface, and of the dichroic reflector 616, define a symmetry axis or optical axis 816b, which passes through an apex 816a of the dichroic reflector and through a central point 829b on the surface 829a of the phosphor layer 829.

The first member 817 may be or comprise a layer of adhesive, optionally bonded to the inner surface 814a and filling the space between surface 814a and 829a. Member 817 may also be or comprise a low refractive index material such as a polymer layer containing gas-filled voids, the voids having a diameter in a range from about 50 to about 400 nm. The voided polymer may be made by curing a monomer containing a solvent, and removing the solvent after curing. Reference is made, for example, to PCT publication WO 2011/0881661. In other embodiments, member 817 may be or comprise an air-filled gap between the surfaces 814a and 829a.

The view of FIG. 12 does not provide complete information regarding the arrangement or layout of the LEDs on the surface 829a. In one embodiment, the LEDs can be grouped together in wedge-shaped regions similar to those shown in FIGS. 4 and 5. For example, LEDs 821a, 822a, 825a may be three LEDs in a group of six neighboring LEDs similar to LEDs 521a, 522a, 523a, 524a, 525a, 526a in FIG. 5, and LEDs 821c, 822c, 824c may be three LEDs out of a group of six neighboring LEDs similar to LEDs 521c, 522c, 523c, 524c, 525c, 526c in FIG. 5. Alternatively, the LEDs may be positioned on the surface 829a in any other arrangement, either in groups of neighboring LEDs, or in a dispersed or spaced-apart arrangement, or in a combination of neighboring and dispersed LEDs, such that light from a given LED is reflected by the dichroic reflector 816 onto a portion of the phosphor surface 829a that is not substantially occluded by other LEDs. In any case, as light propagates from one, some, or all of the LEDs to the dichroic reflector, it does not pass through the phosphor layer. The LEDs may be connected to a controller by lead lines, wire bonds, or other conductive elements that are not shown for simplicity.

In this aspect, the phosphor layer may be arranged in the same or similar manner to the phosphor layers described elsewhere herein. In this aspect, the phosphor layer 829 may comprise a green-emitting phosphor disposed over a substantial portion of reflective substrate 818, wherein, in one embodiment, the phosphor layer may be or comprise a layer of transparent polymer in which a multitude of phosphor particles are dispersed. Suitable green-emitting phosphors are available from, for example, Intermatix and Phosphortech.

In conjunction with the use of a green-emitting phosphor, the LEDs can be grouped into a combination of blue LEDs and red LEDs, where at least one of LEDs 821a, 822a, 825a, 821c, 822c, 824c comprises a red LED, and where green LEDs can be omitted. In this manner, the blue LEDs will emit blue light that is substantially reflected by dichroic reflector 816 onto the phosphor layer, with only a small amount (about 10% or so) of the blue light transmitted through dichroic reflector 816. The red LEDs will emit light that passes directly through dichroic reflector 816. The green light generated by the phosphor layer will also be transmitted through dichroic reflector 816, thus providing a RGB color mix that yields white light, with warm color characteristics.

In a further alternative aspect, the LEDs can be grouped into a combination of blue LEDs and at least one red LED, where a red LED can be disposed in the center of surface 829a, such as at central point 829b. The LEDs 821a, 822a, 825a, 821c, 822c, 824c can comprise blue LEDs or a combination of blue and green LEDs, depending on the type of phosphor being utilized.

As with at least some of the previous embodiments, the phosphor layer 829 is assumed to have a thickness t3 that is small enough so that the layer 829 is partially light-transmissive, such that at least some reflected LED light propagates completely through the layer 829 and strikes the reflective substrate 818. The LED light reflected by the reflective substrate may then propagate back through the phosphor layer 829, for another opportunity to be absorbed by a phosphor material.

The source 810 may be configured to provide a warmer light output. Unlike conventional remote phosphor systems, the red light is emitted directly by the system without the losses normally created by passing through or reflecting off of the phosphor.

MODELED EXAMPLES

A broadband light source similar to that shown in FIG. 6 was modeled with optical design software. The modeled design assumed the source utilized eighteen LEDs arranged into three groups of six neighboring LEDs, substantially as shown in the plan view of FIG. 5. All eighteen LEDs were assumed to have identical physical and optical properties.

Each LED was assumed to be a gallium nitride-on-sapphire (GaN/sapphire) LED die having a square shape in plan view, of dimension 1 mm by 1 mm, and a thickness (see dimension t1 in FIG. 6) of 10 micrometers. The back or rear square surface of each LED was assumed to have a 50% reflectivity at all wavelengths. Each LED die was assumed to emit blue light in an emission band having a peak wavelength of 455 nm and a spectral width, measured as the full-width-at-half-maximum (FWHM), of 15 nm. This blue LED light is plotted on a normalized power scale in FIG. 8 as curve 816. The graph of FIG. 8 also shows the spectral reflectivity of the modeled dichroic reflector for different angles of incidence, discussed further below.

The LEDs were assumed to be immersed in a silicone matrix having a refractive index of 1.41 and a physical thickness (see dimension t2 in FIG. 6) of 49 microns. Atop the layer of silicone was a hemispherical lens of refractive index 1.5, corresponding to element 614 in FIG. 6, which was simulated as Schott™ BK7 glass. The hemispherical lens was assumed to have a radius of curvature of 7.5 mm, and an apex and axis of symmetry as shown in FIG. 6.

Covering the entire curved outer surface of the hemispherical lens was a dichroic reflector. The reflector was assumed to have six microlayers of silicon dioxide ($SiO_2$) interleaved with six microlayers of titanium dioxide ($TiO_2$) so as to form six layer pairs or "optical repeat units". The thickness profile of the layer pairs was tailored to provide the spectral reflectivity shown in FIG. 8. Curve 810 is the reflectivity of the dichroic reflector at an incidence angle of 0 degrees (i.e., normal incidence). Curve 812 is the average reflectivity at an incidence angle of 20 degrees, where "average" here refers to an average of s-polarized light and p-polarized light. Curve 814 is likewise the average reflectivity of the dichroic reflector at an incidence angle of 40 degrees. The incidence angles referred to in this paragraph are incidence angles as measured in the medium of the hemispherical lens, i.e., in a medium of refractive index 1.5. The dichroic reflector was assumed to have no absorption, hence, the percent transmission (or percent average transmission) of the dichroic reflector can be readily calculated as 100% minus the percent reflection (or percent average reflection) for any given incidence angle and wavelength.

Figure 8:
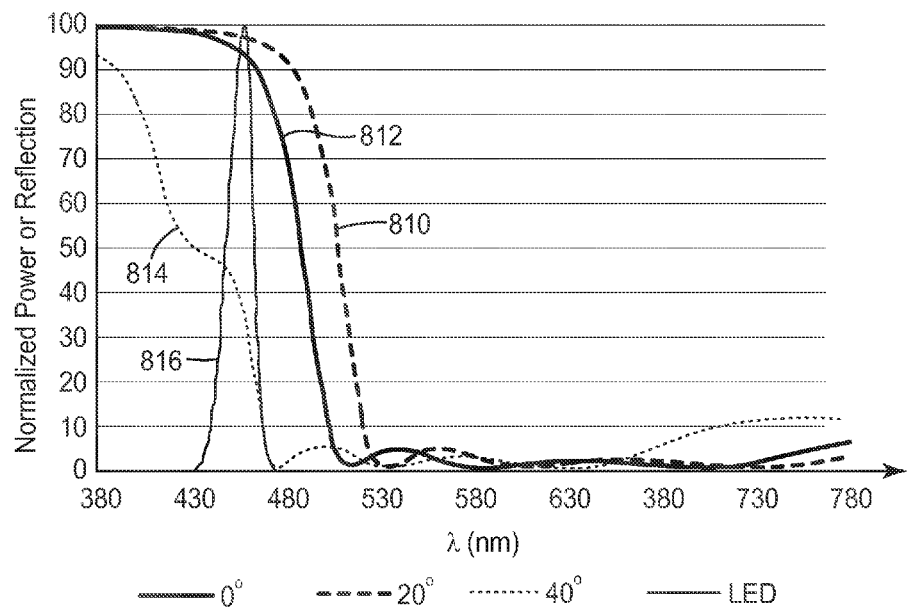
FIG. 8 is a graph of the spectral reflectivity of a modeled dichroic reflector for different angles of incidence, and superimposed thereon a graph of the normalized power spectrum of an exemplary blue LED.

From the graph of FIG. 8, one can see that the dichroic reflector has a band edge or spectral transition region that overlaps in wavelength to some extent with the spectral emission of the LEDs, at least for some angles of incidence at which light from the various LEDs impinge on the dichroic reflector. In this regard, the various LEDs emit light that impinges on the dichroic reflector at different incidence angles, as a result of the arrangement of the LEDs on the surface of the phosphor layer, particularly because of the fact that some LEDs (see e.g. LEDs 521*a*, 521*b*, and 521*c* in FIG. 5) are disposed at relatively small radial distances to the optical axis of the dichroic reflector, and other LEDs (see e.g. LEDs 524*a*, 525*a*, 526*a*, 524*b*, 525*b*, 526*b*, 524*c*, 525*c*, and 526*c* in FIG. 5) are disposed at relatively large radial distances to the optical axis. The modeled LEDs corresponding to LEDs 521*a*, 521*b*, 521*c* in FIG. 5, for example, emit light that impinges on the modeled dichroic reflector at incidence angles that range from about 0 to 12 degrees. The modeled LEDs corresponding to LEDs 524*a*, 526*a*, 524*b*, 526*b*, 524*c*, and 526*c* in FIG. 5, on the other hand, emit light that impinges on the modeled dichroic reflector at incidence angles that range from about 0 to 31 degrees. The incidence angles mentioned in this paragraph are incidence angles as measured in the medium of the hemispherical lens, i.e., in a medium of refractive index 1.5.

The modeled phosphor layer, which was uniform in composition and structure over its entire area, assumed 15 micron diameter spherical particles of Ce:YAG phosphor were uniformly distributed in a transparent material of refractive index 1.8. Ce:YAG absorbs blue and ultraviolet light, and emits light in a relatively smooth emission band that is broadband has a yellow appearance.

The yellow phosphor light, when combined with an appropriate amount of blue LED light, produces nominally white light. The physical thickness of the phosphor layer (see t3 in FIG. 6) was assumed to be 100 micrometers. The concentration of the particles (phosphor concentration) was a variable in the model, and could be selected within a range of 5,000 particles per cubic millimeter to 30,000 particles per cubic millimeter.

The modeled broadband reflector (see element 618 in FIG. 6) was assumed to have a reflectivity that was also a variable in the model. The reflectivity was assumed to be uniform across the entire visible wavelength range.

Figure 9:
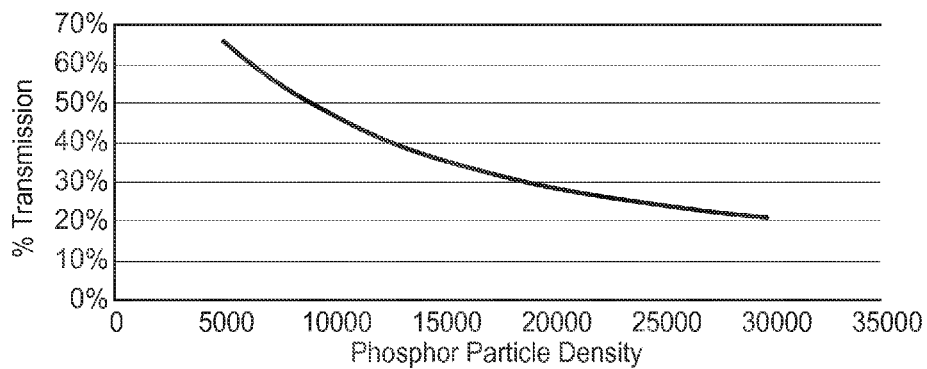
FIG. 9 is a graph of the single-pass transmission through the phosphor layer of a phosphor assembly as a function of phosphor concentration (particle density)

The modeling results of FIG. 9 show the calculated single-pass transmission of normally incident LED light through the phosphor layer 629, as a function of the phosphor concentration or particle density in the phosphor layer. As expected, the transmission decreases as the phosphor concentration increases. For a phosphor particle density of 5,000 particles per cubic millimeter, the transmission is about 65%. For a phosphor particle density of 30,000 particles per cubic millimeter, the transmission is about 20%.

Figure 10:
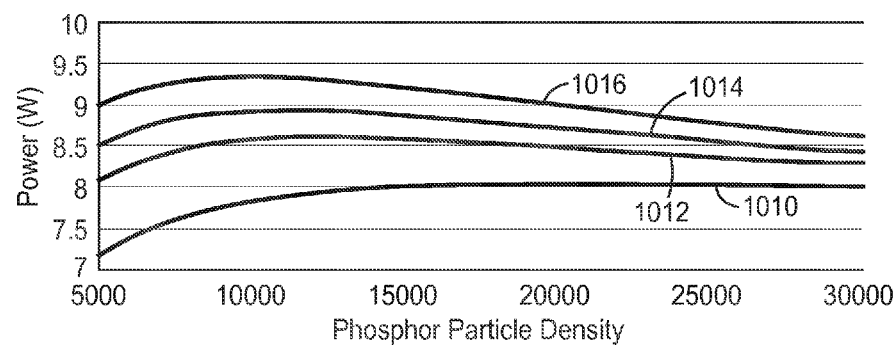
FIG. 10 is a graph of total emission from a remote phosphor broadband light source as a function of phosphor concentration (particle density)

FIG. 10 shows the calculated total emission from (i.e., the total optical power emitted by) the modeled remote phosphor broadband light source, as a function of phosphor concentration and as a function of the reflectivity of the broadband reflector. The total optical power is the sum of the optical power due to LED light that is transmitted by the dichroic reflector, and the optical power due to phosphor light that is transmitted by the dichroic reflector. The curves 1010, 1012, 1014, 1016 correspond to a reflectivity of the broadband reflector 618 of 80%, 90%, 94%, and 98%, respectively. These reflectivity values are assumed to be uniform for all wavelengths.

Some observations can be made regarding the curves in FIG. 10. The progression exhibited by the curves demonstrates that for reflectivities of the broadband reflector of about 80% or less, the total output power appears to monotonically increase as the phosphor concentration increases, approaching a maximum asymptotic value for very high phosphor concentrations. In contrast, however, at least in cases where the broadband reflectivity is 90% or more, the total power exhibits a maximum or peak value that is higher than the asymptotic value, and this peak value is achieved for moderate-to-low concentrations of phosphor. Thus, we have found that, under some conditions, the total output power of the remote phosphor broadband light source can actually be increased by reducing the amount of phosphor in the phosphor layer of the phosphor assembly. This observation can be exploited by light source manufacturers in order to simultaneously conserve phosphor material and boost the total light output of the broadband light sources. Comparison of FIGS. 9 and 10 reveals that a design space of particular interest occurs when the single pass transmission T of the LED light through the phosphor layer is in a range from 30 to 65%, or from 35 to 60%, or from 40 to 50%. Note that these transmission ranges can be achieved by adjusting phosphor concentration in a phosphor layer of fixed thickness, or by adjusting the thickness of a phosphor layer with fixed phosphor concentration, or by adjusting both the thickness and the phosphor concentration of the phosphor layer. The broadband reflector desirably has a reflectivity of at least 90%, or 94%, or 98%.

Figure 11:
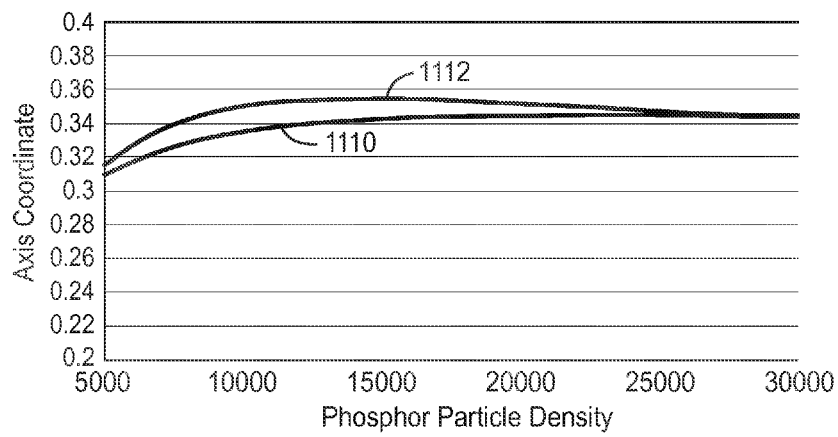
FIG. 11 is a graph of the color coordinates of the broadband output from a remote phosphor broadband light source as a function of phosphor concentration (particle density)

As the phosphor concentration increases from 5,000 to 30,000 particles per cubic millimeter, one would expect the proportion of the total output light associated with phosphor light to increase, and the proportion of the total output light associated with LED light to decrease. Thus, with respect to the modeling results, one would expect the relative mix of LED light and phosphor light to change as a function of the phosphor concentration. In view of this, one may question whether the maximum output powers exhibited by the curves of FIG. 10 correspond to white light, or instead to light that would not be perceived by the ordinary observer as white, e.g., excessively blue or excessively yellow light. The modeling results of FIG. 11 help to answer that question. FIG. 11 plots the CIE color chromaticity x and y coordinates for the total broadband light output of the modeled light source. The CIE chromaticity coordinates, sometimes referred to herein more simply as color coordinates, characterize a mathematically defined color space that was developed by the Commission international de l'eclairage ("CIE", or International Commission on Illumination) in 1931. The x and y chromaticity or color coordinates should not be confused with x and y coordinates associated with physical position or displacement. Unlike the physical coordinates, the (x,y) chromaticity coordinates are unitless. One may define white light as light whose CIE color coordinates (x,y) satisfy $0.25 \leq x \leq 0.4$ and $0.25 \leq y \leq 0.4$, with different points within that defined region corresponding to different shades or hues of white light, e.g., warm white vs. cool white. Curves 1110, 1112 in FIG. 11 correspond to the CIE x-coordinate and the CIE y-coordinate, respectively, of the total output light emitted by the modeled remote phosphor broadband light source in the case where the broadband reflector 618 has a reflectivity of 94%. Inspection of FIG. 11, and comparison with FIG. 10, demonstrates that the maximum output powers exhibited by the curves of FIG. 10 are achieved while maintaining a broadband output that is substantially white in color.

Unless otherwise indicated, all numbers expressing feature sizes, amounts, physical properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application.

Various modifications and alterations of this invention will be apparent to those skilled in the art without departing from the scope and spirit of this invention, and it should be understood that this invention is not limited to the illustrative embodiments set forth herein. All U.S. patents, published and unpublished patent applications, and other patent and non-patent documents referred to herein are incorporated by reference, to the extent they do not directly contradict the foregoing disclosure.

The invention claimed is:

1. An assembly for use in a remote phosphor LED device in which the assembly is illuminated with LED light having an emission peak in a range from 400 to 500 nm, the assembly comprising:
   a phosphor layer configured to absorb a portion of the LED light and emit phosphor light in response to the absorbed LED light; and
   a broadband reflector attached to the phosphor layer;
   wherein the broadband reflector has a reflectivity of at least 90% for the LED light and for the phosphor light; and
   wherein the phosphor layer has a phosphor concentration and physical thickness tailored to provide a single pass transmission of the LED light through the phosphor layer of T, where T is in a range from 30 to 65% single pass transmission through the phosphor layer.

2. The assembly of claim 1, wherein the assembly is die-cuttable.

3. The assembly of claim 1, wherein the broadband reflector attaches directly to the phosphor layer.

4. The assembly of claim 1, wherein the broadband reflector attaches to the phosphor layer through one or more intermediate layers.

5. The assembly of claim 1, further comprising an adhesive layer attached to the phosphor layer.

6. The assembly of claim 1, further comprising a structural layer attached to the phosphor layer, the structural layer being self-supporting.

7. The assembly of claim 1, further comprising a release liner adapted to carry the phosphor layer and the broadband reflector.

8. A remote phosphor lighting system comprising the assembly of claim 1 in combination with one or more LEDs for providing the LED light.

9. The system of claim 8, further comprising a dichroic reflector configured to reflect a first portion of the LED light, to transmit a second portion of the LED light, and to transmit a portion of the phosphor light.

10. A remote phosphor lighting system that provides a broadband light output, the system comprising:
    one or more LEDs adapted to emit LED light having one or more emission peaks in a range from 400 to 500 nm; and
    an assembly including a phosphor layer and a broadband reflector attached to the phosphor layer, the phosphor layer configured to absorb a portion of the LED light and emit phosphor light in response to the absorbed LED light, and the broadband reflector having a reflectivity of at least 90% for the LED light and for the phosphor light;
    wherein the broadband light output comprises a portion of the phosphor light emitted by the assembly and a portion of the LED light reflected by the assembly; and
    wherein the phosphor layer has a phosphor concentration and physical thickness tailored to provide a single pass transmission of the LED light through the phosphor layer of T, where T is selected to maximize the broadband light output.

11. The system of claim 10, further comprising:
    a dichroic reflector configured to reflect a portion of the LED light emitted by the one or more LEDs to impinge on the assembly via light paths that do not pass through the assembly, the dichroic reflector also configured to transmit a portion of the LED light emitted by the one or more LEDs and to transmit a portion of the phosphor light.

12. The system of claim 11, further comprising:
    a lens member having an outer surface and an inner surface, the dichroic reflector being disposed on the outer surface;
    wherein the assembly is oriented such that the phosphor layer is disposed between the lens member and the broadband reflector.

13. The system of claim 10, wherein the broadband light output has CIE color coordinates (x, y), and wherein x is in a range from 0.25 to 0.4, and wherein y is in a range from 0.25 to 0.4.

14. The system of claim 10, wherein the phosphor layer is a green-emitting phosphor.

15. An assembly for use in a remote phosphor LED device in which the assembly is illuminated with LED light, the assembly comprising:
- an array of one or more LEDs to emit first LED light in the range of 400 to 500 nm;
- a phosphor layer configured to absorb a portion of the first LED light and emit phosphor light in response to the absorbed first LED light;
- at least one additional LED to emit red LED light;
- a dichroic reflector configured to reflect a first portion of the first LED light, to transmit a second portion of the LED light, to transmit the red LED light, and to transmit a portion of the phosphor light; and
- a broadband reflector attached to the phosphor layer, wherein the broadband reflector has a reflectivity of at least 90% for the first LED light and for the phosphor light.

* * * * *